(12) United States Patent
Zhang et al.

(10) Patent No.: US 9,019,647 B2
(45) Date of Patent: Apr. 28, 2015

(54) SYSTEMS AND METHODS FOR CONDITIONAL POSITIVE FEEDBACK DATA DECODING

(75) Inventors: Fan Zhang, Milpitas, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 136 days.

(21) Appl. No.: 13/596,947

(22) Filed: Aug. 28, 2012

(65) Prior Publication Data

US 2014/0063636 A1    Mar. 6, 2014

(51) Int. Cl.
| | |
|---|---|
| G11B 5/09 | (2006.01) |
| G11B 20/10 | (2006.01) |
| H03M 7/00 | (2006.01) |
| H04L 27/06 | (2006.01) |
| H03M 13/11 | (2006.01) |
| H03M 13/37 | (2006.01) |
| H03M 13/00 | (2006.01) |
| G11B 5/012 | (2006.01) |
| H03M 13/15 | (2006.01) |
| H03M 13/41 | (2006.01) |

(52) U.S. Cl.
CPC . *G11B 5/09* (2013.01); *G11B 5/012* (2013.01); *G11B 20/10268* (2013.01); *G11B 20/10509* (2013.01); *H03M 7/00* (2013.01); *H04L 27/06* (2013.01); *H03M 13/1128* (2013.01); *H03M 13/1515* (2013.01); *H03M 13/3753* (2013.01); *H03M 13/41* (2013.01); *H03M 13/6331* (2013.01); *H03M 13/6343* (2013.01)

(58) Field of Classification Search
None
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |

(Continued)

OTHER PUBLICATIONS

U.S. Appl. No. 13/426,714, Shaohua Yang.

(Continued)

*Primary Examiner* — Wayne Young
*Assistant Examiner* — Brian Butcher
(74) *Attorney, Agent, or Firm* — Hamilton DeSanctis & Cha

(57) ABSTRACT

The present inventions are related to systems and methods for information data processing included selective decoder message determination. In one example, a data processing system is disclosed that includes a data decoder circuit operable to apply a conditional data decoding algorithm to a data set to yield a decoded output. The conditional decoding algorithm is operable to calculate node messages using an approach selected from a group consisting of: a first message determination mechanism, and a second message determination mechanism; where one of the first message determination mechanism and the second message determination mechanism is selected based upon a condition that includes a global iteration count applied to the data set.

22 Claims, 6 Drawing Sheets

(56) References Cited

U.S. PATENT DOCUMENTS

| | | | |
|---|---|---|---|
| 5,898,710 | A | 4/1999 | Amrany |
| 5,923,713 | A | 7/1999 | Hatakeyama |
| 5,978,414 | A | 11/1999 | Nara |
| 5,983,383 | A | 11/1999 | Wolf |
| 6,005,897 | A | 12/1999 | Mccalissister |
| 6,023,783 | A | 2/2000 | Divsalar |
| 6,029,264 | A | 2/2000 | Kobayashi |
| 6,065,149 | A | 5/2000 | Yamanaka |
| 6,097,764 | A | 8/2000 | McCallister |
| 6,145,110 | A | 11/2000 | Khayrallah |
| 6,216,249 | B1 | 4/2001 | Bliss |
| 6,216,251 | B1 | 4/2001 | McGinn |
| 6,266,795 | B1 | 7/2001 | Wei |
| 6,317,472 | B1 | 11/2001 | Choi |
| 6,351,832 | B1 | 2/2002 | Wei |
| 6,377,610 | B1 | 4/2002 | Hagenauer |
| 6,381,726 | B1 | 4/2002 | Weng |
| 6,473,878 | B1 | 10/2002 | Wei |
| 6,535,553 | B1 | 3/2003 | Limberg et al. |
| 6,625,775 | B1 | 9/2003 | Kim |
| 6,748,034 | B2 | 6/2004 | Hattori |
| 6,757,862 | B1 | 6/2004 | Marianetti, II |
| 6,785,863 | B2 | 8/2004 | Blankenship |
| 6,810,502 | B2 | 10/2004 | Eidson |
| 6,970,511 | B1 | 11/2005 | Barnette |
| 6,986,098 | B2 | 1/2006 | Poeppelman |
| 7,047,474 | B2 | 5/2006 | Rhee |
| 7,058,873 | B2 | 6/2006 | Song |
| 7,073,118 | B2 | 7/2006 | Greenberg |
| 7,093,179 | B2 | 8/2006 | Shea |
| 7,117,427 | B2 | 10/2006 | Ophir |
| 7,133,228 | B2 | 11/2006 | Fung |
| 7,184,486 | B1 | 2/2007 | Wu |
| 7,191,378 | B2 | 3/2007 | Eroz |
| 7,203,887 | B2 | 4/2007 | Eroz |
| 7,308,061 | B1 | 12/2007 | Huang |
| 7,310,768 | B2 | 12/2007 | Eidson |
| 7,313,750 | B1 | 12/2007 | Feng |
| 7,370,258 | B2 | 5/2008 | Iancu |
| 7,415,651 | B2 | 8/2008 | Argon |
| 7,502,189 | B2 | 3/2009 | Sawaguchi |
| 7,523,375 | B2 | 4/2009 | Spencer |
| 7,587,657 | B2 | 9/2009 | Haratsch |
| 7,590,168 | B2 | 9/2009 | Raghavan |
| 7,646,829 | B2 | 1/2010 | Ashley |
| 7,702,986 | B2 | 4/2010 | Bjerke |
| 7,752,523 | B1 | 7/2010 | Chaichanavong |
| 7,779,325 | B2 | 8/2010 | Song |
| 7,802,172 | B2 | 9/2010 | Vila Casado |
| 7,952,824 | B2 | 5/2011 | Dziak |
| 7,958,425 | B2 | 6/2011 | Chugg |
| 7,996,746 | B2 | 8/2011 | Livshitz |
| 8,018,360 | B2 | 9/2011 | Nayak |
| 8,201,051 | B2 | 6/2012 | Tan |
| 8,237,597 | B2 | 8/2012 | Liu |
| 8,261,171 | B2 | 9/2012 | Annampedu |
| 8,291,284 | B2 | 10/2012 | Savin |
| 8,295,001 | B2 | 10/2012 | Liu |
| 2008/0069373 | A1 | 3/2008 | Jiang |
| 2008/0304558 | A1 | 12/2008 | Zhu et al. |
| 2009/0132893 | A1 | 5/2009 | Miyazaki |
| 2009/0185643 | A1 | 7/2009 | Fitzpatrick |
| 2011/0167227 | A1 | 7/2011 | Yang |
| 2011/0264987 | A1 | 10/2011 | Li |
| 2012/0124118 | A1 | 5/2012 | Ivkovic |
| 2012/0182643 | A1 | 7/2012 | Zhang |
| 2012/0207201 | A1 | 8/2012 | Xia |
| 2012/0212849 | A1 | 8/2012 | Xu |
| 2012/0262814 | A1 | 10/2012 | Li |
| 2012/0265488 | A1 | 10/2012 | Sun |
| 2013/0254616 | A1* | 9/2013 | Yang .............................. 714/752 |
| 2014/0032982 | A1* | 1/2014 | Zhang et al. .................... 714/49 |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/186,234, filed Jul. 19, 2011, Haitao Xia, Unpublished.

U.S. Appl. No. 13/327,279, filed Dec. 15, 2011, Wei Feng, Unpublished.

U.S. Appl. No. 13/340,974, filed Dec. 30, 2011, Dan Liu, Unpublished.

U.S. Appl. No. 13/445,848, filed Apr. 12, 2012, Bruce Wilson, Unpublished.

U.S. Appl. No. 13/340,951, filed Dec. 30, 2011, Lei Chen, Unpublished.

U.S. Appl. No. 13/369,468, filed Feb. 9, 2012, Zongwang Li, Unpublished.

U.S. Appl. No. 13/269,852, filed Oct. 10, 2011, Haitao Xia, Unpublished.

U.S. Appl. No. 13/284,730, filed Oct. 28, 2011, Fan Zhang, Unpublished.

(56) References Cited

OTHER PUBLICATIONS

U.S. Appl. No. 13/295,150, filed Nov. 14, 2011, Zongwang Li, Unpublished.
U.S. Appl. No. 13/284,767, filed Oct. 28, 2011, Fan Zhang, Unpublished.
U.S. Appl. No. 13/269,832, filed Oct. 10, 2011, Haitao Xia, Unpublished.
U.S. Appl. No. 13/445,878, filed Apr. 12, 2012, Yu Liao, Unpublished.
U.S. Appl. No. 13/239,683, filed Sep. 22, 2011, Changyou Xu, Unpublished.
U.S. Appl. No. 13/283,549, filed Oct. 27, 2011, Wu Chang, Unpublished.
U.S. Appl. No. 13/213,751, filed Aug. 19, 2011, Fan Zhang, Unpublished.
U.S. Appl. No. 13/174,537, filed Jun. 30, 2011, Anantha Raman Krishnan, Unpublished.
U.S. Appl. No. 13/296,022, filed Nov. 14, 2011, Victor Krachkovsky, Unpublished.
U.S. Appl. No. 13/305,551, filed Nov. 28, 2011, Yang Han, Unpublished.
U.S. Appl. No. 13/227,416, filed Sep. 7, 2011, Lei Chen, Unpublished.
U.S. Appl. No. 13/305,510, filed Nov. 28, 2011, Lei Chen, Unpublished.
U.S. Appl. No. 13/302,119, filed Nov. 22, 2011, Lei Chen, Unpublished.
U.S. Appl. No. 13/300,078, filed Nov. 18, 2011, Chung-Li Wang, Unpublished.
U.S. Appl. No. 13/174,453, filed Jun. 30, 2011, Johnson Yen, Unpublished.
U.S. Appl. No. 13/180,495, filed Jul. 11, 2011, Chung-Li Wang, Unpublished.
U.S. Appl. No. 13/415,326, filed Mar. 8, 2012, Shaohua Yang, Unpublished.
U.S. Appl. No. 13/227,544, filed Sep. 8, 2011, Shaohua Yang, Unpublished.
U.S. Appl. No. 13/483,100, filed May 30, 2012, Fan Zhang, Unpublished.
U.S. Appl. No. 13/426,693, filed Mar. 22, 2012, Shaohua Yang, Unpublished.
U.S. Appl. No. 13/545,833, filed Jul. 10, 2012, Zhi Bin Li, Unpublished.
U.S. Appl. No. 13/483,105, filed May 30, 2012, Xuebin Wu, Unpublished.
U.S. Appl. No. 13/316,741, filed Dec. 12, 2011, Yang Han, Unpublished.
U.S. Appl. No. 13/113,219, filed May 23, 2011, Yang Han, Unpublished.
U.S. Appl. No. 13/415,430, filed Mar. 8, 2012, Nayak Ratnakar Aravind, Unpublished.
U.S. Appl. No. 13/171,615, filed Jun. 29, 2011, Bradley D. Seago, Unpublished.
U.S. Appl. No. 13/474,660, filed May 17, 2012, Zongwang Li, Unpublished.
U.S. Appl. No. 13/422,986, filed Mar. 16, 2012, Fan Zhang, Unpublished.
U.S. Appl. No. 13/372,580, filed Feb. 14, 2012, Fan Zhang, Unpublished.
U.S. Appl. No. 13/426,714, filed Mar. 22, 2012, Shaohua Yang, Unpublished.
U.S. Appl. No. 13/412,520, filed Mar. 5, 2012, Fan Zhang, Unpublished.
U.S. Appl. No. 13/362,409, filed Jan. 31, 2012, Fan Zhang, Unpublished.
U.S. Appl. No. 13/316,858, filed Dec. 12, 2011, Zongwang Li, Unpublished.
U.S. Appl. No. 13/433,693, filed Mar. 29, 2012, Fan Zhang, Unpublished.
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
"Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

SYSTEMS AND METHODS FOR CONDITIONAL POSITIVE FEEDBACK DATA DECODING

BACKGROUND OF THE INVENTION

The present inventions are related to systems and methods for data processing, and more particularly to systems and methods for data decoding.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Depending upon a number of factors, different data sets require more or fewer iterations through the data detector circuit and/or the data decoder circuit. In some cases, more iterations alone do not allow for convergence of the processing data set.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data processing systems include a data decoder circuit that is operable to apply a conditional data decoding algorithm to a data set to yield a decoded output. The conditional decoding algorithm is operable to calculate node messages using either a first message determination mechanism, and a second message determination mechanism. The selection between the first message determination mechanism and the second message determination mechanism is based upon a condition.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS OF THE INVENTION

Figure 1:
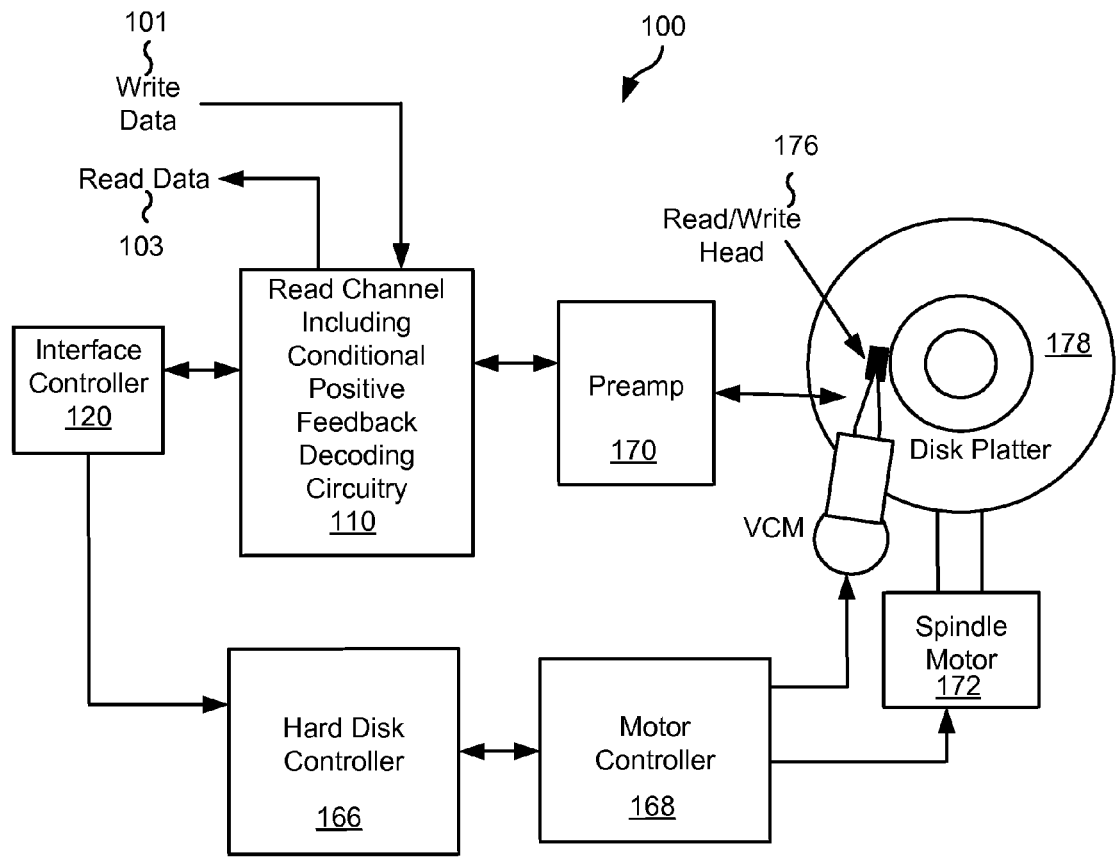
FIG. 1 shows a storage system including conditional positive feedback decoding circuitry in accordance with various embodiments of the present invention.

The present inventions are related to systems and methods for data processing, and more particularly to systems and methods for data decoding.

It has been discovered that introducing positive feedback in decoder messaging can create a system perturbation sufficient to move an iterative data processing algorithm away from a trapping set or other impediment to convergence. In some embodiments of the present invention, such positive feedback is applied to decoder message determination whenever a defined condition is achieved. The condition may include, for example, a particular global and local iteration during which a defined threshold of messages used in the determination match each other. Where this condition is met, positive feedback is applied in the message determination of the data decoder circuit.

Various embodiments of the present invention provide data processing systems include a data decoder circuit that is operable to apply a conditional data decoding algorithm to a data set to yield a decoded output. The conditional decoding algorithm is operable to calculate node messages using either a first message determination mechanism, and a second message determination mechanism. The selection between the first message determination mechanism and the second message determination mechanism is based upon a condition. In some instances of the aforementioned embodiments, the condition includes a global iteration count applied to the data set. In one or more instances of the aforementioned embodiments, the condition includes a local iteration count applied to the data set. In various instances of the aforementioned embodiments, includes a number of messages feeding a given node that match. In some such instances, the number of messages is a majority of messages feeding the given node. In one or more such instances, the given node is selected as one of a check node and a variable node. In various cases, the first message determination mechanism is a feed forward determination mechanism, and the second message determination message is a positive feedback determination mechanism. In some such cases, the condition is based at least in part on a number of messages feeding a given node that match, and the positive feedback determination mechanism includes setting the value of the messages for a next iteration equal to the value of the messages that correspond to the message used in the number of messages feeding the given node.

Other embodiments of the present invention provide methods for data processing that includes: receiving a data set; determining a processing condition; and applying a data decoding algorithm by a data decoder circuit to the data set to yield a decoded output. Applying the data decoding algorithm includes: selecting one of a first message determination mechanism and a second message determination mechanism as a selected message determination mechanism based at least in part on the processing condition; and performing the selected message determination mechanism. In some instances of the aforementioned embodiments, the processing condition is based upon at least one of: a global iteration count applied to the data set, a local iteration count applied to the data set, and a number of messages feeding a given node that match. In some cases, the processing condition is based upon a combination of at least two of: the global iteration count applied to the data set, the local iteration count applied to the data set, and the number of messages feeding the given node that match. In particular cases, the given node is selected from a group consisting of: a check node, and a variable node. In one or more cases, the first message determination mechanism is a feed forward determination mechanism, and the second message determination message is a positive feedback determination mechanism. In various cases, the processing condition is based at least in part on a number of messages feeding a given node that match; and the positive feedback determination mechanism includes setting the value of the messages for a next iteration equal to the value of the messages that correspond to the message used in the number of messages feeding the given node.

Turning to FIG. 1, a storage system 100 including a read channel circuit 110 having conditional positive feedback decoding circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 applies a data detection algorithm by a data detector circuit to the received data set to yield a detected output. The detected output is provided to a data decoder circuit that applies a data decoding algorithm to yield a decoded output. This decoded output may be fed back to data detector circuit where it guides re-application of the data detection algorithm. This iterative process may continue until either a timeout condition is achieved, or until the original data is recovered. During this processing, the data decoder circuit generally applies a feed forward message determination process. However where a defined condition is met, a positive feedback is added to the standard feed forward message determination. In some cases, the read channel circuit may be implemented similar to that discussed in relation to FIGS. 3a-3d; and/or may operate similar to the methods discussed below in relation to FIGS. 4a-4c.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
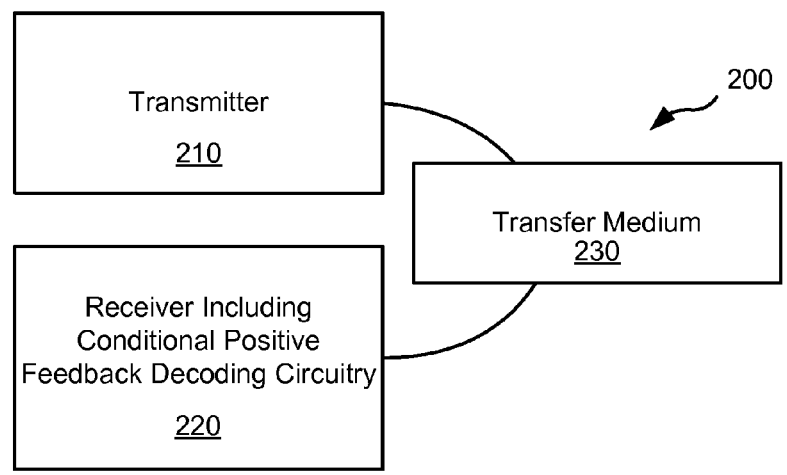
FIG. 2 depicts a data transmission system including conditional positive feedback decoding circuitry in accordance with one or more embodiments of the present invention.

Turning to FIG. 2, a data transmission system 200 including a receiver 220 having conditional positive feedback decoding circuitry is shown in accordance with various embodiments of the present invention. Data transmission system 200 includes a transmitter 210 that is operable to transmit encoded information via a transfer medium 230 as is known in the art. The encoded data is received from transfer medium 230 by a receiver 220. Receiver 220 processes the received input to yield the originally transmitted data.

As part of processing the received information, receiver 295 applies a data detection algorithm by a data detector circuit to the received data set to yield a detected output. The detected output is provided to a data decoder circuit that applies a data decoding algorithm to yield a decoded output. This decoded output may be fed back to data detector circuit where it guides re-application of the data detection algorithm. This iterative process may continue until either a timeout condition is achieved, or until the original data is recovered. During this processing, the data decoder circuit generally applies a feed forward message determination process. However where a defined condition is met, a positive feedback is added to the standard feed forward message determination. In some cases, the read channel circuit may be implemented similar to that discussed in relation to FIGS. 3a-3d; and/or may operate similar to the methods discussed below in relation to FIGS. 4a-4c.

FIG. 3 shows a data processing circuit 300 a data decoder circuit with conditional positive feedback circuitry in accordance with some embodiments of the present invention. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input signal 308 is derived from a read/write head assembly (not shown) that is disposed in relation to a storage medium (not shown). In other cases, analog input signal 308 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input signal 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art. It may be possible that equalized output 322 may be received directly from a storage device in, for example, a solid state storage system. In such cases, analog front end circuit 310, analog to digital converter circuit 315 and equalizer circuit 320 may be eliminated where the data is received as a digital data input. Equalized output 322 is stored to a sample buffer circuit 375 that includes sufficient memory to maintain one or more codewords until processing of that codeword is completed through a data detector circuit 325 and a data decoder circuit 350 including, where warranted, multiple "global iterations" defined as passes through both data detector circuit 325 and data decoder circuit 350 and/or "local iterations" defined as passes through data decoding circuit 350 during a given global iteration. Sample buffer circuit 375 stores the received data as buffered data 377.

Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Based upon the disclosure provided herein, one of ordinary skill in the art will recognize a variety of data detector circuits that may be used in relation to different embodiments of the present invention. Detected output 325 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. When data decoder circuit 350 is available, data decoder circuit 350 receives detected output 327 from central queue memory 360 as a decoder input 356. Data decoder circuit 350 applies a data decoding algorithm to decoder input 356 in an attempt to recover originally written data. Application of the data decoding algorithm includes passing messages between variable and check nodes as is known in the art. In most cases, the message passing includes standard belief propagation or feed forward messaging where two or more messages feeding the variable or check node are used to calculate or determine a message to be passed to another node. A graphic 600 of FIG. 3c shows an example of such standard belief propagation where three variable nodes are connected to one check node. In this situation, a message x from a variable node 610 and a message y from a variable node 615 are passed to a check node 605. In turn, check node 605 calculates a message z that is passed to a variable node 620. Similarly, a graphic 650 of FIG. 3c shows another example of such standard belief propagation where three check nodes are connected to one variable node. In this situation, a message a from x check node 660 and a message y from a check node 665 are passed to a variable node 655. In turn, variable node 655 calculates a message c that is passed to a check node 670.

In contrast, where a defined condition is met, the message passing includes novel positive feedback message determination. A graphic 700 of FIG. 3d shows an example of such novel positive feedback message determination where three variable nodes are connected to one check node. In this situation, a message x from a variable node 710 and a message y from a variable node 715, and a message z from variable node 720 are passed to a check node 705. In turn, check node 705 calculates a message z' that is passed to variable node 720. Similarly, a graphic 750 of FIG. 3d shows another example of such standard belief propagation where three check nodes are connected to one variable node. In this situation, a message x from a check node 760, a message y from a check node 765, and a message z from check node 770 are passed to a variable node 755. In turn, variable node 755 calculates a message z' that is passed to check node 770.

Various conditions may be used to trigger the positive feedback message determination. Such conditions may be determined based upon circuit simulations that reveal conditions specific to a given circuit when the positive feedback message determination would be advantageous. For example, positive feedback message determination may be considered advantageous when the probability that a majority of the messages received by a given node are correct is twice the probability that the same majority of messages is incorrect. In such a condition, it has been found that positive feedback message determination results in a reduction in errors when compared to standard belief propagation or feed forward message determination. Using such a metric applied to the two input graphics 700, 750 described above in relation to FIG. 3d, positive feedback message determination is applied when, for example, x=y=Value (i.e., a majority of the input messages match). Further, this positive feedback message determination may be limited to application only during particular global/local iterations through data detector circuit 325 and data decoder circuit 350. For example, in one particular embodiment of the present invention, positive feedback message determination may be applied when a majority of the messages to a node (i.e., either a variable node or check node) match during any local iteration of either the first global iteration or the tenth global iteration. Where the condition is met, the messages for the succeeding local iteration (i.e., x', y', z') are all set equal to the value of the majority of messages (i.e., Value). Using the graphics of FIG. 7 as an example, where x=y=Value during a defined global/local iteration, the preceding messages are set in accordance with the following equation: x'=y'=z'=Value. Doing so effectuates the positive feedback message determination prescribed when the condition is met.

Figure 3A:
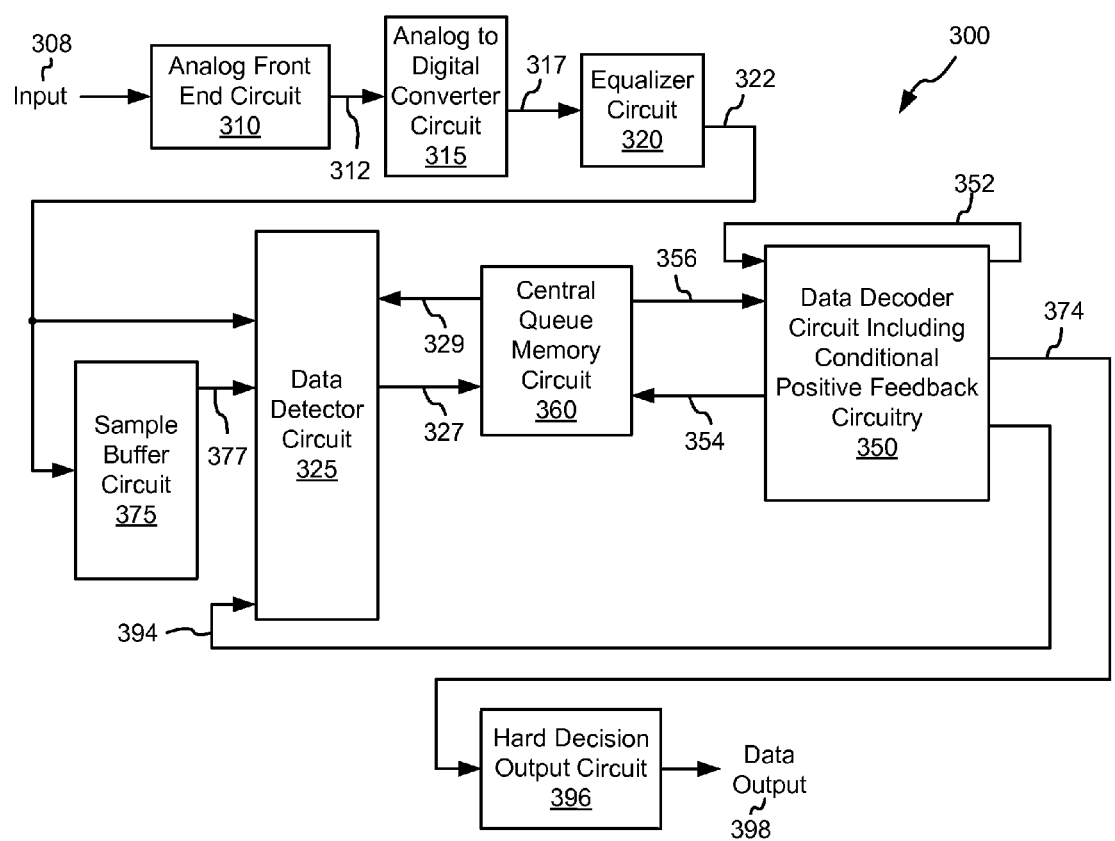
FIG. 3a-d shows a data processing circuit including a data decoder circuit with conditional positive feedback circuitry in accordance with some embodiments of the present invention.
Figure 3B:
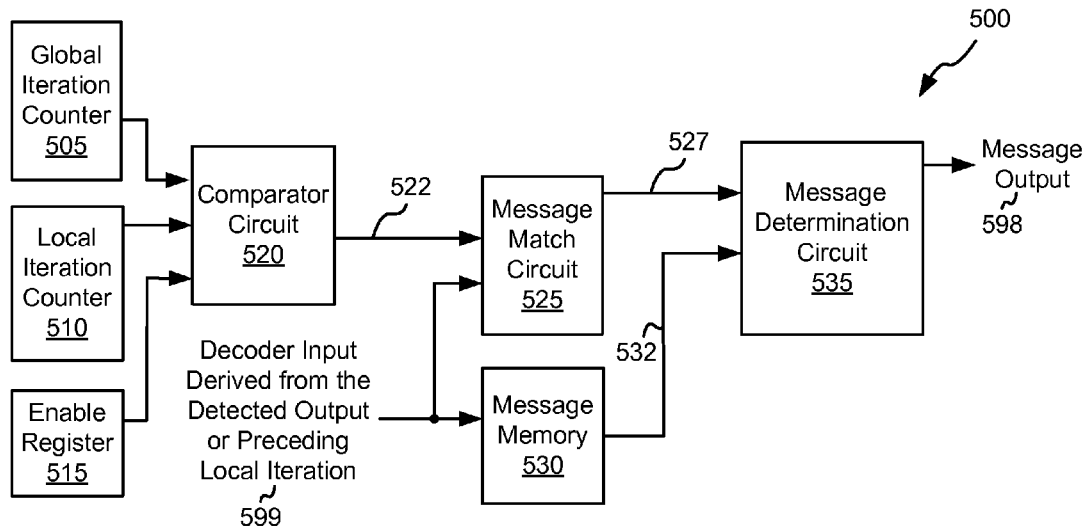
Figure 3C:
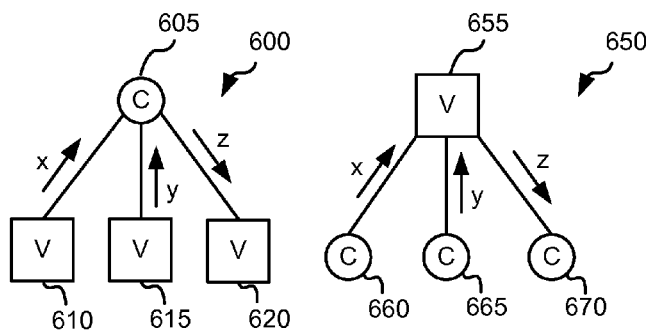
Figure 3D:
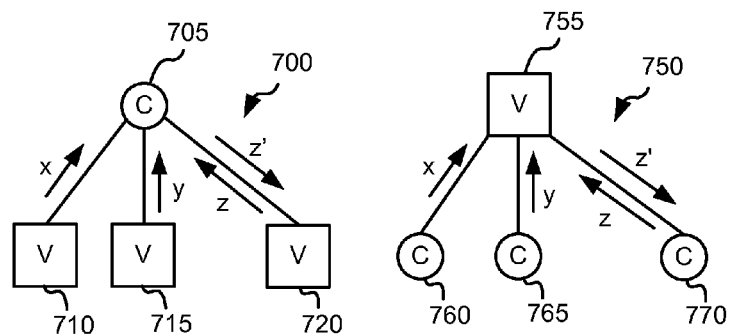

Turning to FIG. 3b, an example message determination circuit 500 that may be used as part of data decoder circuit 350. Message determination circuit 500 includes a global iteration counter 505 operable to indicate the number of global iterations (i.e., passes through both data detector circuit 325 and data decoder circuit 350) that have been applied to a currently processing data set, and a local iteration counter 510 operable to indicate the number of local iterations (i.e., passes through data decoder circuit 350 during any given global iteration). An enable register 515 is a user programmable register operable to receive an indication of which combinations of global and local iterations that positive feedback message determination is enabled. The combinations of global and local iterations from enable register 515 are provided to a comparator circuit 520 where they are compared against the current global and local iteration number from global iteration counter 505 and local iteration counter 510 being applied to the currently processing data set. Where there is a match, comparator circuit 520 asserts an iteration enable 522 to a message match circuit 525.

Message match circuit 525 compares the messages received for a given node. Thus, for example, using the graphics of FIGS. 3c and 3d, message match circuit 525 compares messages x and y for a given check node or variable node. Where a majority of the messages match and iteration enable 522 is asserted, message match circuit 525 asserts a message match enable 527. Otherwise, message match circuit 525 de-asserts message match enable 527. Again, using the graphics of FIGS. 3c and 3d, where message x equals message y and iteration enable 522 is asserted, message match circuit 525 asserts message match enable 527. Alternatively, where either iteration enable 522 is not asserted or message x is not equal to message y, message match circuit 525 de-asserts message match enable 527.

Message match enable 527 is provided to message determination circuit 535. A message memory 530 stores messages from a preceding global iteration (i.e., a preceding decoder input derived from the detected output 599) that are provided as the message output 532 (e.g., x, y, z) to message determination circuit 535. In addition, decoder input 599 derived from the detected output is provided to message determination circuit 535. Where match enable 527 is not asserted, message determination circuit 535 provides a message output 598 calculated using standard belief propagation or feed forward message determination as graphically depicted in FIG. 3c. Alternatively, where match enable 527 is asserted indicating a majority of the messages for the given node (i.e., check node or variable node) matched (e.g., x=y=Value), then message determination circuit 535 sets the next messages equal to the majority value (e.g, x'=y'=z'=Value) which is provided as message output 598.

Returning to FIG. 3a, the result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 350 provides the result of the data decoding algorithm as a data output 374. Data output 374 is provided to a hard decision output circuit 396 where the data is reordered before providing a series of ordered data sets as a data output 398.

One or more iterations through the combination of data detector circuit 325 and data decoder circuit 350 may be made in an effort to converge on the originally written data set. As mentioned above, processing through both the data detector circuit and the data decoder circuit is referred to as a "global iteration". For the first global iteration, data detector circuit 325 applies the data detection algorithm without guidance from a decoded output. For subsequent global iterations, data detector circuit 325 applies the data detection algorithm to buffered data 377 as guided by decoded output 354. Decoded output 354 is received from central queue memory 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from a decoded output 352. For subsequent local iterations, data decoder circuit 350 applies the data decoding algorithm to decoder input 356 as guided by a previous decoded output 352. In some embodiments of the present invention, a default of ten local iterations is allowed for each global iteration.

Figure 4A:
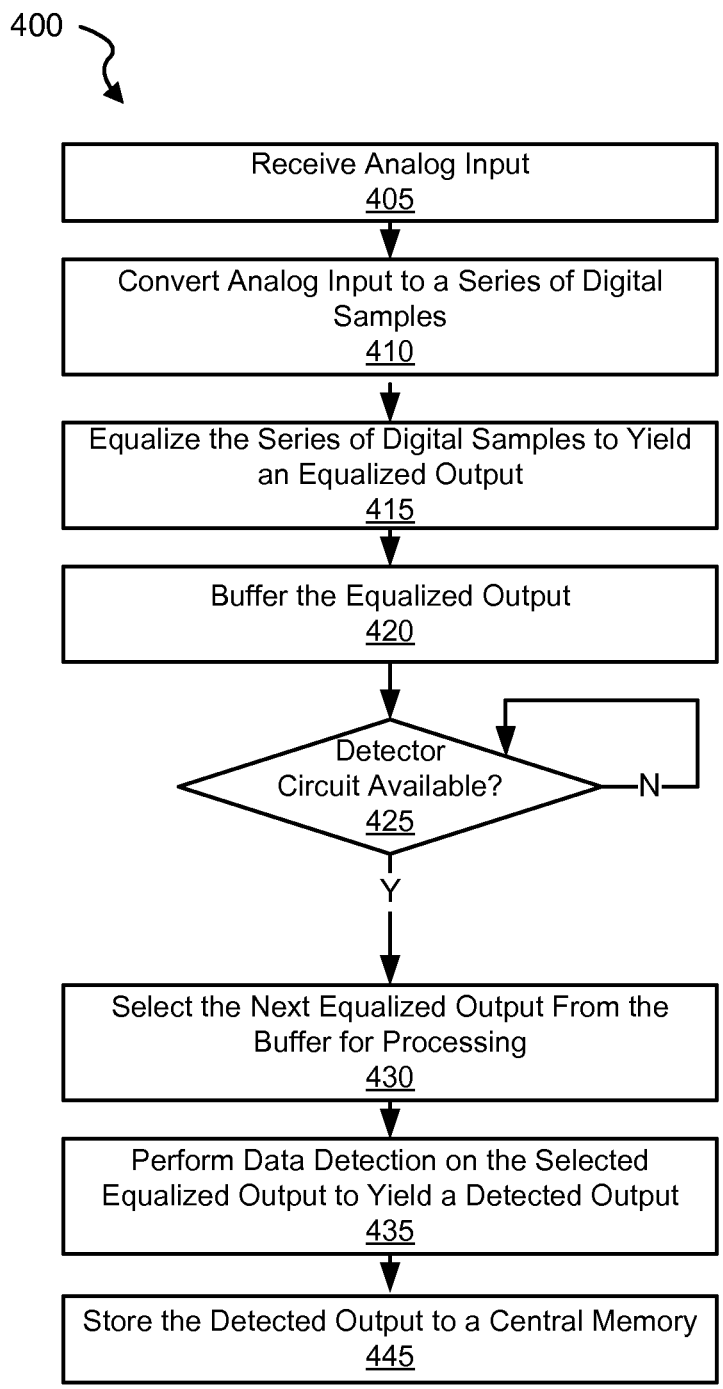
FIGS. 4a-4c are flow diagrams showing a method for conditional positive feedback processing in accordance with some embodiments of the present invention.
Figure 4B:
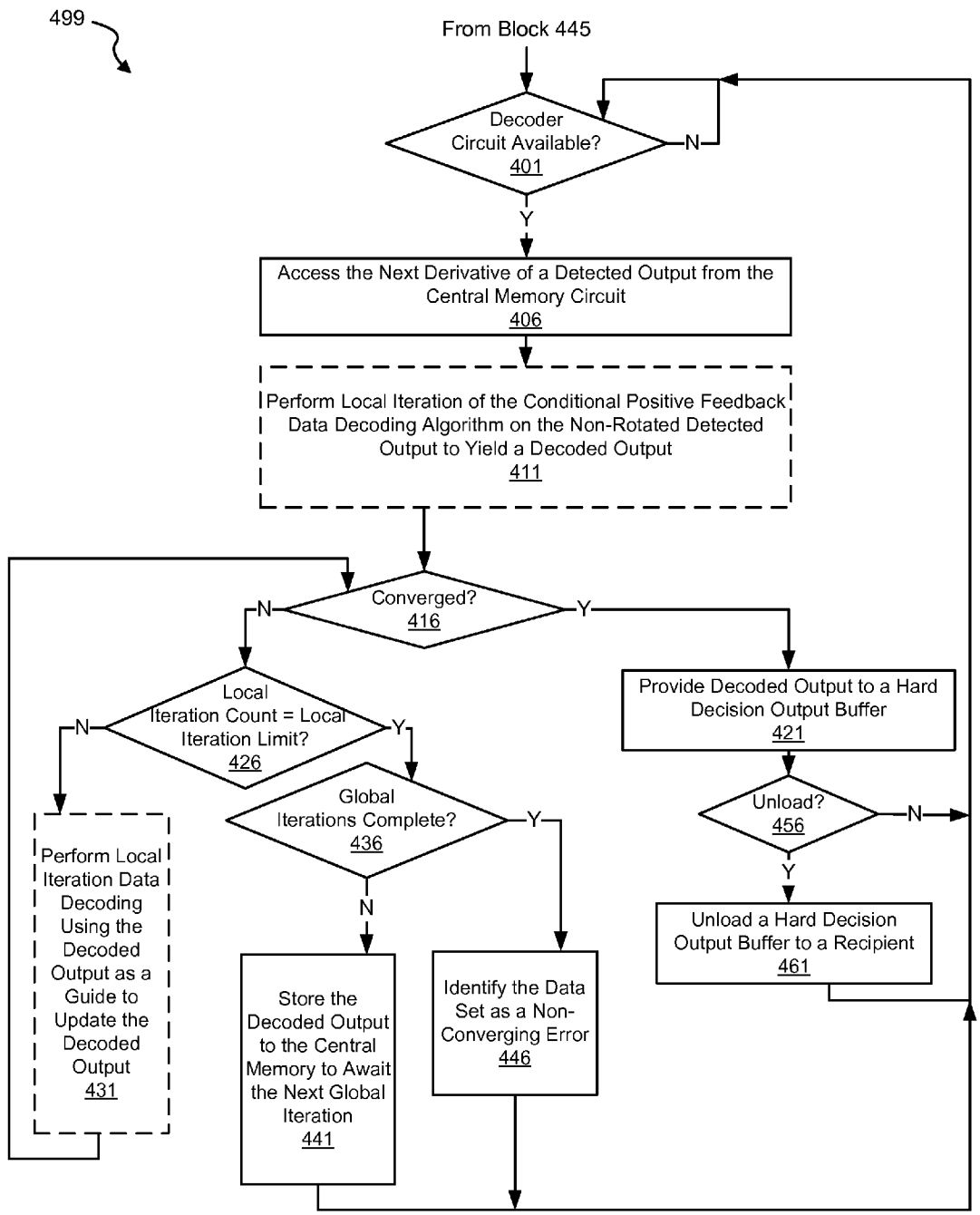
Figure 4C:
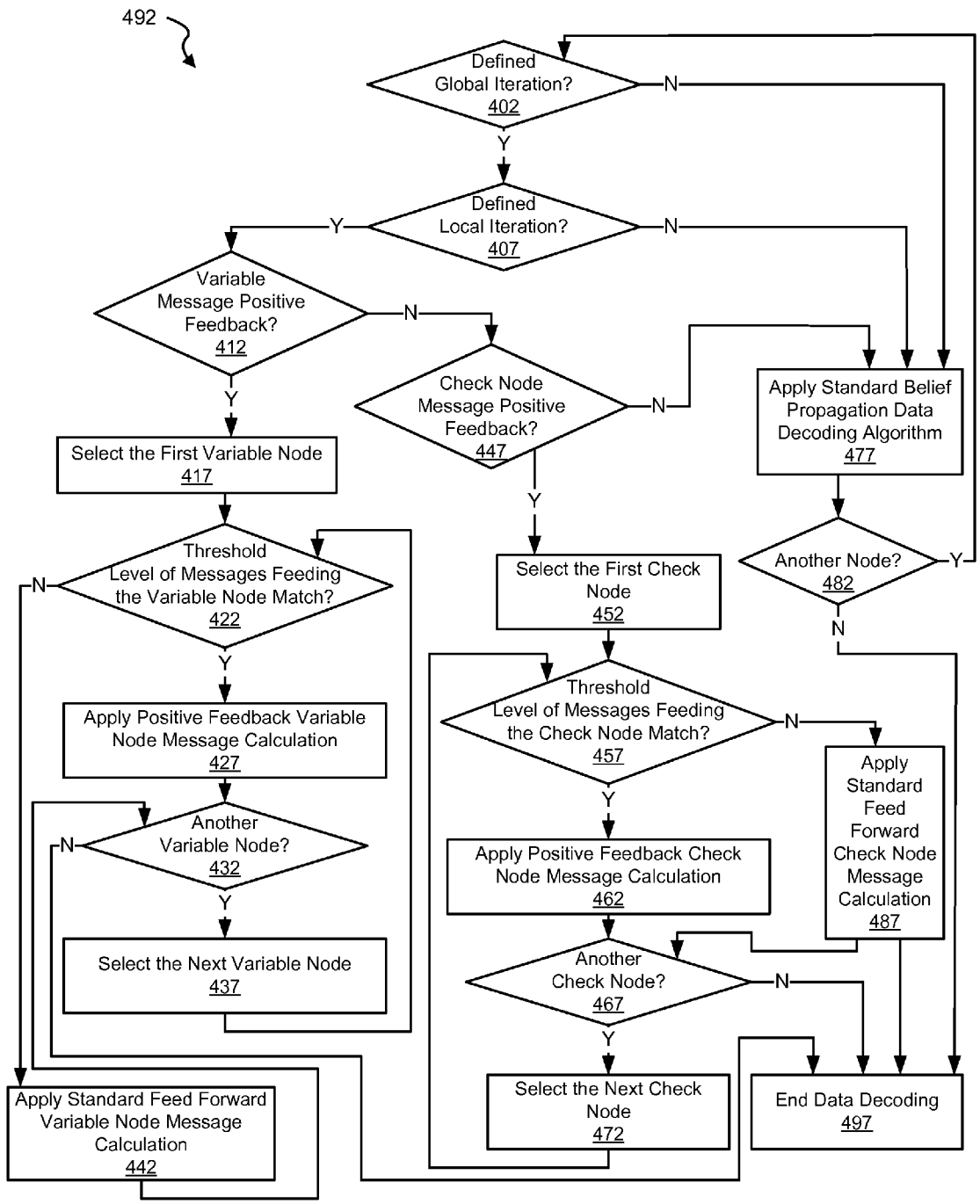

Turning to FIGS. 4a-4c are flow diagrams 400, 499, 492 showing a method for conditional positive feedback processing in accordance with some embodiments of the present invention. Following flow diagram 400 of FIG. 4a, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether a data detector circuit is available to process a data set (block 425). Where a data detector circuit is available to process a data set (block 425), the next equalized output from the buffer is accessed for processing (block 430). The data detector circuit may be, for example, a Viterbi algorithm data detector circuit or a maximum a posteriori data detector circuit. The next equalized output selected for processing by the available data detector circuit (block 430), is selected based upon a quality metric that is calculated as more fully discussed below in relation to block 440. A data detection algorithm is applied to the accessed equalized output by the data detector circuit to yield a detected output (block 435). The detected output is stored to a central queue memory circuit where it awaits processing by a data decoder circuit (block 445).

Turning to FIG. 4b and following flow diagram 499, it is determined whether a data decoder circuit is available (block 401) in parallel to the previously described data detection process of FIG. 4a. The data decoder circuit may be, for example, a low density parity check data decoder circuit as are known in the art. Where the data decoder circuit is available (block 401) the next derivative of a detected output is selected from the central queue memory circuit (block 406). The derivative of the detected output may be, for example, an interleaved (shuffled) version of a detected output from the data detector circuit. A first local iteration of a data decoding algorithm is applied by the data decoder circuit to the selected detected output to yield a decoded output (block 411). The data decoding algorithm includes conditionally application positive feedback message determination. Block 411 is shown in dashed lines indicating that further detail of the conditional processing is set forth in relation to flow diagram 492 of FIG. 4c. It is then determined whether the decoded output converged (e.g., resulted in the originally written data as indicated by the lack of remaining unsatisfied checks) (block 416).

Where the decoded output converged (block 416), it is provided as a decoded output codeword to a hard decision output buffer (e.g., a re-ordering buffer) (block 421). It is determined whether the received output codeword is either sequential to a previously reported output codeword in which case reporting the currently received output codeword immediately would be in order, or that the currently received output codeword completes an ordered set of a number of codewords in which case reporting the completed, ordered set of codewords would be in order (block 456). Where the currently received output codeword is either sequential to a previously reported codeword or completes an ordered set of codewords (block 456), the currently received output codeword and, where applicable, other codewords forming an in order sequence of codewords are provided to a recipient as an output (block 461).

Alternatively, where the decoded output failed to converge (e.g., errors remain) (block 416), it is determined whether the number of local iterations already applied equals the maximum number of local iterations (block 426). In some cases, a default seven local iterations are allowed per each global iteration. Based upon the disclosure provided herein, one of ordinary skill in the art will recognize another default number of local iterations that may be used in relation to different embodiments of the present invention. Where another local iteration is allowed (block 426), the data decoding algorithm is applied to the selected data set using the decoded output as a guide to update the decoded output (block 431). Again, the data decoding algorithm includes conditionally application positive feedback message determination. Block 431 is shown in dashed lines indicating that further detail of the conditional processing is set forth in relation to flow diagram 492 of FIG. 4c. The processes of blocks starting at block 416 are repeated for the next local iteration.

Alternatively, where all of the local iterations have occurred (block 426), it is determined whether all of the global iterations have been applied to the currently processing data set (block 436). Where the number of global iterations has not completed (block 436), the decoded output is stored to the central queue memory circuit to await the next global iteration (block 441). Alternatively, where the number of global iterations has completed (block 436), an error is indicated and the data set is identified as non-converging (block 446).

Turning to flow diagram 492 of FIG. 4c, conditional positive feedback message determination is discussed. Following flow diagram 492, it is determined whether the current global iteration for the processing data set is equal to a defined global iteration (block 402). The defined global iteration may be user programmable and selected based upon circuit simulation. Where the current global iteration for the processing data set is not equal to the defined global iteration (block 402), standard feed forward or belief propagation message determination is performed as part of the decoding algorithm (block 477). It is then determined whether another node remains to be analyzed (block 482). Where another node remains (block 482), the process starting at block 402 is repeated for the next node. Otherwise, where no additional node remains to be analyzed (block 482), the data decoding algorithm ends (block 497).

Where, on the other hand, it is determined whether the current global iteration for the processing data set is equal to a defined global iteration (block 402), It is determined whether the current local iteration for the processing data set is equal to the defined local iteration (block 407). The defined local iteration may be user programmable and selected based upon circuit simulation. Where the current local iteration for the processing data set is not equal to the defined local iteration (block 407), standard feed forward or belief propagation message determination is performed as part of the decoding algorithm (block 477). It is then determined whether another node remains to be analyzed (block 482). Where another node remains (block 482), the process starting at block 402 is repeated for the next node. Otherwise, where no additional node remains to be analyzed (block 482), the data decoding algorithm ends (block 497).

Alternatively, where the current local iteration for the processing data set is equal to the defined local iteration (block 407), it is determined whether a variable node is being processed and conditional positive feedback is allowed for variable nodes (block 412). Where a variable node is being processed (block 412), an initial variable node is selected (block 417), and it is determined whether a threshold level of the messages feeding the variable node match (block 422). In some embodiments of the present invention, the threshold level is a majority. Using the graphics of FIG. 3d as an example, where x=y=Value during a defined global/local iteration, then the threshold level is met. Where the threshold level of matching messages is met (block 422), a positive feedback variable node message determination is performed (block 427). Such positive feedback variable node message determination includes assigning the messages for the next variable node equal to the value common to the majority messages. Using the graphics of FIG. 3d as an example, where x=y=Value during a defined global/local iteration, then the values x', y', z' for the next local iteration are set equal to Value.

It is then determined whether another variable node remains to be processed (block 432). Where another variable node remains to be processed (block 432), the next variable node is selected (block 437), and the processes of blocks 422-437 are repeated for the next variable node. Otherwise, where another variable node does not remain (block 432), the data decoding algorithm ends (block 497). Alternatively, where the threshold level of messages is not met (block 422), standard feed forward or belief propagation message determination is performed as part of the decoding algorithm (block 442).

Alternatively, it is determined whether a check node is being processed and conditional positive feedback is allowed for check nodes (block 447), an initial check node is selected (block 452), and it is determined whether a threshold level of the messages feeding the check node match (block 457). In some embodiments of the present invention, the threshold level is a majority. Using the graphics of FIG. 3d as an example, where x=y=Value during a defined global/local iteration, then the threshold level is met. Where the threshold level of matching messages is met (block 457), a positive feedback check node message determination is performed (block 462). Such positive feedback check node message determination includes assigning the messages for the next variable node equal to the value common to the majority messages. Using the graphics of FIG. 3d as an example, where x=y=Value during a defined global/local iteration, then the values x', y', z' for the next local iteration are set equal to Value.

It is then determined whether another check node remains to be processed (block 467). Where another variable node remains to be processed (block 467), the next check node is selected (block 472), and the processes of blocks 457-467 are repeated for the next check node. Otherwise, where another check node does not remain (block 467), the data decoding algorithm ends (block 497). Alternatively, where the threshold level of messages is not met (block 457), standard feed forward or belief propagation message determination is performed as part of the decoding algorithm (block 487).

Where, on the other hand, a check node is not being processed or conditional positive feedback is not allowed for check nodes (block 447), standard feed forward or belief propagation message determination is performed as part of the decoding algorithm (block 477). It is then determined whether another node remains to be analyzed (block 482). Where another node remains (block 482), the process starting at block 402 is repeated for the next node. Otherwise, where no additional node remains to be analyzed (block 482), the data decoding algorithm ends (block 497).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
    a data decoder circuit operable to apply a conditional data decoding algorithm to a data set to yield a decoded output; wherein the conditional decoding algorithm is operable to calculate node messages using an approach selected from a group consisting of: a first message determination mechanism, and a second message determination mechanism; wherein one of the first message determination mechanism and the second message determination mechanism is selected based upon a condition that includes a global iteration count applied to the data set.

2. The data processing system of claim 1, wherein the first message determination mechanism is a feed forward determination mechanism, and wherein the second message determination message is a positive feedback determination mechanism.

3. The data processing system of claim 2, wherein the condition is based at least in part on a number of messages feeding a given node that match; and wherein the positive feedback determination mechanism includes setting the value of the messages for a next iteration equal to the value of the messages that correspond to the message used in the number of messages feeding the given node.

4. The data processing system of claim 1, wherein the data processing system further comprises:
    a data detector circuit operable to apply a data detection algorithm to an input to yield a detected output, and wherein the data set is derived from the detected output.

5. The data processing system of claim 4, wherein the data detector circuit is selected from a group consisting of: a maximum a posteriori data detector circuit, and a Viterbi algorithm data detector circuit.

6. The data processing system of claim 1, wherein the data decoder circuit is a low density data decoder circuit.

7. The data processing system of claim 1, wherein the system is implemented as an integrated circuit.

8. The data processing system of claim 1, wherein the system is implemented as part of device selected from a group consisting of: a storage device, and a communication device.

9. A method for data processing, the method comprising: receiving a data set; determining a processing condition; and applying a data decoding algorithm by a data decoder circuit to the data set to yield a decoded output, wherein applying the data decoding algorithm includes: selecting one of a first message determination mechanism and a second message determination mechanism as a selected message determination mechanism based at least in part on the processing condition, wherein the first message determination mechanism is a feed forward determination mechanism, and wherein the second message determination message is a positive feedback determination mechanism where a result of a check node is fed back as an input to the same check node; and performing the selected message determination mechanism, wherein the processing condition is based at least in part on a number of messages feeding a given node that match; and wherein the positive feedback determination mechanism includes setting the value of the messages for a next iteration equal to the value of the messages that correspond to the message used in the number of messages feeding the given node.

10. The method of claim 9, wherein the processing condition is based upon at least one of: a global iteration count applied to the data set, a local iteration count applied to the data set, and a number of messages feeding a given node that match.

11. The method of claim 10, wherein the processing condition is based upon a combination of at least two of: the global iteration count applied to the data set, the local iteration count applied to the data set, and the number of messages feeding the given node that match.

12. The method of claim 10, wherein the given node is selected from a group consisting of: a check node, and a variable node.

13. A data processing system, the data processing system comprising:
a data decoder circuit operable to apply a conditional data decoding algorithm to a data set to yield a decoded output; wherein the conditional decoding algorithm is operable to calculate node messages using an approach selected from a group consisting of: a first message determination mechanism, and a second message determination mechanism; wherein one of the first message determination mechanism and the second message determination mechanism is selected based upon a condition that includes a number of messages feeding a given node that match.

14. The data processing system of claim 13, wherein the number of messages is a majority of messages feeding the given node.

15. The data processing system of claim 13, wherein the given node is selected from a group consisting of: a check node, and a variable node.

16. The data processing system of claim 13, wherein the first message determination mechanism is a feed forward determination mechanism, and wherein the second message determination mechanism is a positive feedback determination mechanism.

17. The data processing system of claim 16, wherein the positive feedback determination mechanism feeds a result of a check node back to the same check node for inclusion in the next result from the check node.

18. The data processing system of claim 16, wherein the condition is based at least in part on a number of messages feeding a given node that match; and wherein the positive feedback determination mechanism includes setting the value of the messages for a next iteration equal to the value of the messages that correspond to the message used in the number of messages feeding the given node.

19. The data processing system of claim 13, wherein the data processing system is implemented as part of a storage device, and wherein the storage device includes:
a storage medium;
a head assembly disposed in relation to the storage medium and operable to provide a sensed signal corresponding to a data set on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set; and
a data detector circuit operable to apply a data detection algorithm to the sample set to yield the data set.

20. The data processing system of claim 19, wherein the storage medium is a disk platter, and wherein the storage device further includes a solid state memory in addition to the disk platter.

21. The data processing system of claim 1, wherein the data processing system is implemented as part of a storage device, and wherein the storage device includes:
a storage medium;
a head assembly disposed in relation to the storage medium and operable to provide a sensed signal corresponding to a data set on the storage medium;
a read channel circuit including:
an analog front end circuit operable to provide an analog signal corresponding to the sensed signal;
an analog to digital converter circuit operable to sample the analog signal to yield a series of digital samples;
an equalizer circuit operable to equalize the digital samples to yield a sample set; and
a data detector circuit operable to apply a data detection algorithm to the sample set to yield the data set.

22. The data processing system of claim 2, wherein the positive feedback determination mechanism feeds a result of a check node back to the same check node for inclusion in the next result from the check node.

* * * * *